(12) United States Patent
Adivarahan et al.

(10) Patent No.: US 9,142,714 B2
(45) Date of Patent: Sep. 22, 2015

(54) HIGH POWER ULTRAVIOLET LIGHT EMITTING DIODE WITH SUPERLATTICE

(75) Inventors: Vinod Adivarahan, Columbia, SC (US);
Qhalid Fareed, Columbia, SC (US);
Asif Khan, Irmo, SC (US)

(73) Assignee: NITEK, INC., Columbia, SC (US)

( * ) Notice: Subject to any disclaimer, the term of this patent is extended or adjusted under 35 U.S.C. 154(b) by 0 days.

(21) Appl. No.: 13/403,151

(22) Filed: Feb. 23, 2012

(65) Prior Publication Data

US 2012/0145994 A1 Jun. 14, 2012

Related U.S. Application Data

(62) Division of application No. 12/576,859, filed on Oct. 9, 2009.

(60) Provisional application No. 61/136,869, filed on Oct. 9, 2008.

(51) Int. Cl.
*H01L 33/08* (2010.01)
*H01L 33/38* (2010.01)
(Continued)

(52) U.S. Cl.
CPC ............ *H01L 33/08* (2013.01); *H01L 21/0237* (2013.01); *H01L 21/0254* (2013.01);
(Continued)

(58) Field of Classification Search
None
See application file for complete search history.

(56) References Cited

U.S. PATENT DOCUMENTS 6,653,248 B2 * 11/2003 Kean et al. ............... 438/22
7,064,356 B2 * 6/2006 Stefanov et al. ........... 257/99
(Continued)

FOREIGN PATENT DOCUMENTS

WO WO 2008/054994 5/2008
WO WO 2008/054995 5/2008
(Continued)

OTHER PUBLICATIONS

Adivarahan et al., Robust 290 nm Emission Light Emitting Diodes over Pulsed Laterally Overgrown AlN, Jpn. J. Appl. Phys. 46 (2007) pp. L877-L879, published on Sep. 14, 2007.*
(Continued)

*Primary Examiner* — Andres Munoz
(74) *Attorney, Agent, or Firm* — Michael A. Mann; Nexsen Pruet, LLC

(57) ABSTRACT

An improved process for forming a UV emitting diode is described. The process includes providing a substrate. A super-lattice is formed directly on the substrate at a temperature of at least 800 to no more than 1,300° C. wherein the super-lattice comprises $Al_xIn_yGa_{1-x-y}N$ wherein $0<x\le1$, $0\le y\le1$ and $0<x+y\le1$. A first conductive layer with a first type of conductivity is formed on the super-lattice wherein the first conductive layer comprises $Al_xIn_yGa_{1-x-y}N$ wherein $0<x\le1$, $0\le y\le1$ and $0<x+y\le1$. A quantum well region is formed on the first conductive layer wherein the quantum well region comprises $Al_xIn_yGa_{1-x-y}N$ wherein $0<x\le1$, $0\le y\le1$ and $0<x+y\le1$. A second conductive layer is formed on the quantum well with a second type of conductivity wherein the second conductive layer comprises $Al_xIn_yGa_{1-x-y}N$ wherein $0<x\le1$, $0\le y\le1$ and $0<x+y\le1$. A first metal contact is formed in electrical contact with the first conductive layer and a second metal contact is formed in electrical contact with the second conductive layer.

14 Claims, 4 Drawing Sheets

(51) Int. Cl.
*H01L 21/02* (2006.01)
*H01L 33/00* (2010.01)
*H01L 33/40* (2010.01)
*H01L 33/64* (2010.01)

(52) U.S. Cl.
CPC .... *H01L21/02458* (2013.01); *H01L 21/02507* (2013.01); *H01L 33/007* (2013.01); *H01L 33/38* (2013.01); *H01L 33/40* (2013.01); *H01L 33/641* (2013.01)

(56) References Cited

U.S. PATENT DOCUMENTS

| | | | |
|---|---|---|---|
| 8,222,669 | B2 | 7/2012 | Khan et al. |
| 8,242,484 | B2 | 8/2012 | Khan |
| 8,304,756 | B2 | 11/2012 | Khan |
| 8,354,663 | B2 | 1/2013 | Adivarahan et al. |
| 8,354,687 | B1 | 1/2013 | Adivarahan et al. |
| 8,372,697 | B2 | 2/2013 | Khan et al. |
| 2001/0028063 | A1* | 10/2001 | Koike et al. .......... 257/94 |
| 2003/0141507 | A1* | 7/2003 | Krames et al. ........ 257/79 |
| 2004/0224484 | A1 | 11/2004 | Fareed et al. |
| 2006/0091409 | A1 | 5/2006 | Epler et al. |
| 2006/0163590 | A1 | 7/2006 | Erchak et al. |
| 2006/0186422 | A1 | 8/2006 | Gaska et al. |
| 2007/0141258 | A1 | 6/2007 | Fareed et al. |
| 2010/0032647 | A1 | 2/2010 | Khan et al. |
| 2010/0140745 | A1 | 6/2010 | Khan et al. |
| 2010/0187545 | A1 | 7/2010 | Khan et al. |
| 2010/0213436 | A1 | 8/2010 | Khan |
| 2010/0264401 | A1 | 10/2010 | Adivarahan et al. |
| 2010/0314605 | A1 | 12/2010 | Khan |
| 2010/0320440 | A1 | 12/2010 | Khan |
| 2011/0012089 | A1 | 1/2011 | Khan et al. |
| 2011/0017976 | A1 | 1/2011 | Khan et al. |
| 2011/0073838 | A1 | 3/2011 | Khan et al. |
| 2011/0127571 | A1 | 6/2011 | Khan et al. |
| 2011/0220867 | A1 | 9/2011 | Khan et al. |
| 2012/0034718 | A1 | 2/2012 | Khan |
| 2013/0017689 | A1 | 1/2013 | Khan et al. |

FOREIGN PATENT DOCUMENTS

| | | |
|---|---|---|
| WO | WO 2009/005894 A2 | 1/2009 |
| WO | WO 2009/023722 A1 | 2/2009 |
| WO | WO 2009/120975 A2 | 10/2009 |
| WO | WO 2009/120986 A2 | 10/2009 |
| WO | WO 2009/120990 A2 | 10/2009 |
| WO | WO 2009/120998 A2 | 10/2009 |

OTHER PUBLICATIONS

Nakamura, InGaN/GaN/AlGaN-Based Laser Diodes with an Estimated Lifetime of Longer than 10,000 Hours, MRS Proceedings 1997 482, pp. 1145-1156.*

* cited by examiner

HIGH POWER ULTRAVIOLET LIGHT EMITTING DIODE WITH SUPERLATTICE

CROSS-REFERENCE TO RELATED APPLICATIONS

The present application is a divisional application of pending Ser. No. 12/576,859 filed Oct. 9, 2009 which, in turn, claims priority to U.S. Provisional Patent No. 61/136,869 filed Oct. 9, 2008 which is incorporated herein by reference.

BACKGROUND

The present invention is directed to an improved ultraviolet (UV) light emitting diode. More specifically, the present invention is related to an improved UV light emitting diode which can be manufactured without a low temperature buffer layer thereby providing improved efficiency, improved processing and an enhanced ability to incorporate heat dissipation technology.

UV light emitting diodes are highly desirable for a number of applications and proposed applications. They are expected to find great utility in such diverse areas as bio-chemical sensors, air and water purification, food processing and packaging, and various forms of medical applications such as dentistry, dermatology and optometry.

The shorter wavelength radiation is also expected to be advantageous for use in optical data storage systems such as optical disk wherein the data density can be increased over longer wavelength systems. Other areas could also benefit from a high energy, efficient, UV diode.

UV and deep-UV diodes typically utilize unitary, binary, ternary, quaternary and penternary group III metal nitrides such as AlN, GaN, InN, AlGaN, AlInN, GaInN, AlGaInN and BAlInGaN. The inherent properties of these materials have thwarted full exploitation of UV emitting diodes. These materials have inherently high electrical resistance and low thermal conductivity. As a result the amount of current which can be supplied to the diode is limited by internal heating which decreases the amount of light that can be generated relative to visible emitting diodes.

Yet another problem with group III nitrides is the lack of a suitable support upon which the materials can be grown. The most common supports, such as sapphire, have lattice parameters which are sufficiently different from the group III nitrides that crystal defects are generated at the interface with the substrate. The defects propagate into the active layers of the diode structure thereby further decreasing efficiency. Also, due to the difference in the coefficient of thermal expansion of group III nitrides, relative to typical supports, significant crack formation occurs during subsequent processing.

Lattice defects and thermal expansion cracking are typically mitigated by a low temperature buffer layer which is grown at a relatively low temperature of 400 to less than 700° C. between the substrate and the active layers of the diode. Low temperature buffer layers are typically a relatively soft material, such as AlN, wherein the thermal expansion differences are dampened. Buffer layers also have the advantage of significantly reducing lattice defects. The lattice defects are effectively terminated within the buffer layer and therefore do not reach the active layers.

The diode is often separated from the substrate by cleavage at the low temperature buffer by known techniques such as laser lift-off. Unfortunately, the cleavage is not clean and typically some fraction of the low temperature buffer layer material remains on the substrate with an uneven surface remaining on the diode. The uneven exterior of the diode further decreases diode quality and efficiency due to light attenuation and light scatter.

A large portion of the research efforts related to UV diodes has focused on improving the buffer layer, methods for forming the buffer layer and manufacturing a ultraviolet light emitting diode. Pulsed growth techniques have been demonstrated to be particularly beneficial. A particularly efficient buffer layer is formed by a pulsed lateral overgrowth (PLOG) technique described in commonly assigned U.S. patent application Ser. No. 12/445,959, now U.S. Pat. No. 8,304,756, and which corresponds to WO 2008/054994, both of which are incorporated herein by reference. Another method for forming a buffer layer is pulsed atomic layer epitaxy (PALE) which is described in commonly owned application. WO2009/023722, which corresponds to U.S. Pat. No. 8,354,663, which are both incorporated herein by reference. Another method of improving the stability of the device, is forming an array of light-emitting devices (LED) and a method for making an array of LED's, particularly one that emits deep ultraviolet light which is described in commonly owned application WO2009/023722, cited above.

Even with the highly advanced methods of forming buffers the problems associated with thermally induced cracks and crystalline defects from lattice mismatches remains. These problems, though mitigated, still limit the full exploitation of UV diodes.

There has been an ongoing effort to further mitigate the deficiencies described above. The present invention advances the art by techniques which are considered to be a contrary approach.

However, there remains a need for a higher quality, more reliable, more robust, deep UV light-emitting diodes and laser diode arrays.

Milli-watt power DUV LEDs on sapphire substrates with AlGaN multiple quantum well (MQW) active regions have been previously reported for the UVA, UVB and the UVC regions. The LED design used in the prior art benefited from several key innovations, namely: (1) the use of pulsed atomic layer epitaxy (PALE) to improve the quality of the buffer AlN layer; (2) the use of a PALE deposited AlN/Al$_x$Ga$_{1-x}$N, short-period super-lattice layer insertion between the buffer AlN and the n-contact AlGaN layer for controlling the thin-film stress and mitigating epilayer cracking; and (3) a p-GaN/p-AlGaN hetero-junction contact layer for improved hole injection.

To date, under a cw-pump current of 20 mA, the average output powers for state-of-the-art UVC and UVB LEDs are about 1 mW. These LEDs typically have effective areas ranging from approximately 200 μm×200 μm to 300 μm×300 μm with various geometrical shapes demonstrated. Due to the poor thermal conductivity of the sapphire substrates, the output power quickly saturates at pump currents around 40-50 mA. At 20 mA pump current, the device lifetimes (50% power reduction) are approximately 1000 h for packaged devices that are flip-chipped to a heat sink. Without being constrained by theory, the key reasons for this power/lifetime limitation are the dislocations in the active region and the excessive heating due to the high device series and poor thermal conductivity of sapphire. Unfortunately, many commercial applications require the output powers and lifetimes to be significantly better than the best values reported to date.

The high operating voltages, or high series resistance, of deep UV LED's stems from poor or lower doping efficiency of high aluminum content epilayers needed for such short wavelength emission. The series resistance further increases the temperature rise of the active junction by joule heating which then results in degraded device performance. The problem becomes severe with decreasing emission wavelength and with increasing device area. Increasing the device active area has adverse effects due to the severe crowding in high aluminum content layers. The present invention solves this problem.

The present invention reduces series resistance which results in a decrease in joule heating. In the micro-pillar design the diameter is within the charge spreading length. For example, for a 280 nm UV LED the mesa diameter is preferably about 25-30 µm which is less than, the estimated current spreading length of 40 µm. Furthermore, the micropillar is surrounded by n-type electrode with a small distance of separation between the pillar edge and the n-type electrode edge. Since these micropillars are immersed in a pool of n-type electrode and the diameter is less than the current spreading length the current crowding problem is eliminated. Moreover, by interconnecting each pillar with the novel flat electrode over a leakage suppression layer the total device area can be increased which reduces the device resistance and operating voltages. As a consequence of this reduction, the device is much cooler than conventional UV LED's which helps in biasing these UV LEDs to much higher drive currents for a stable high power performance.

It will be apparent to those skilled in the art of ultraviolet light-emitting diodes and laser diodes that many modifications and substitutions can be made to the preferred embodiments described herein without departing from the spirit and scope of the present invention, defined by the appended claims.

SUMMARY OF THE INVENTION

It is an object of the invention to provide an improved ultraviolet emitting diode.

It is another object of the present invention to provide an improved ultraviolet emitting diode which is highly efficient with regards to light emission as a function of current.

The present invention provides an ultra-violet light-emitting array with substrate lifted-off for efficient thermal dissipation and method for fabricating an ultraviolet light emitting array.

A particular feature of the present invention is improved processability, and specifically, improved quality of a diode after being laser lifted from a substrate.

A super-lattice is formed directly on the substrate at a temperature of at least 700° C. to no more than 1,300° C. wherein the super-lattice comprises $Al_xIn_yGa_{1-x-y}N$ wherein $0<x\leq1$, $0\leq y\leq1$ and $0<x+y\leq1$. A first conductive layer with a first type of conductivity is formed on the super-lattice wherein the first conductive layer comprises $Al_xIn_yGa_{1-x-y}N$ wherein $0<x\leq1$, $0\leq y\leq1$ and $0<x+y\leq1$. A quantum well region is formed on the first conductive layer wherein the quantum well region comprises $Al_xIn_yGa_{1-x-y}N$ wherein $0<x\leq1$, $0\leq y\leq1$ and $0<x+y\leq1$. A second conductive layer is formed on the quantum well with a second type of conductivity wherein the second conductive layer comprises $Al_xIn_yGa_{1-x-y}N$ wherein $0<x\leq1$, $0\leq y\leq1$ and $0<x+y\leq1$. A first metal contact is formed in electrical contact with the first conductive layer and a second metal contact is formed in electrical contact with the second conductive layer.

These and other advantages, as will be realized, are provided in a UV light emitting diode and process for forming a stable high power UV emitting diode. The process includes providing a substrate.

DETAILED DESCRIPTION

The present invention is specific to an improved UV light emitting diode. More specifically, the invention is related to a UV light emitting diode which lacks a low temperature buffer layer yet which has a high illumination efficiency and improved processing.

The invention will be described with reference to the various figures without limit thereto. In the figures similar elements will be numbered accordingly.

Figure 1:
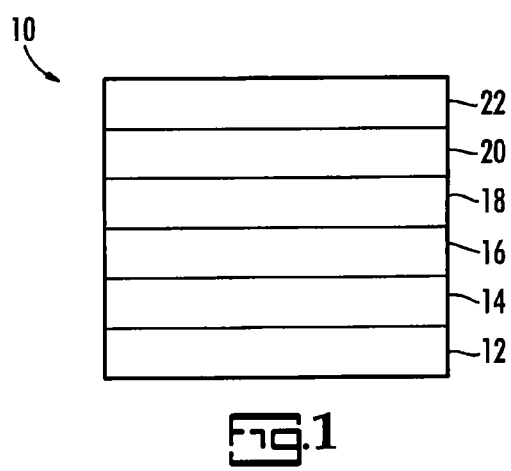
FIG. 1 is a cross-sectional schematic view of an embodiment of the invention.

An embodiment of the invention is set forth in schematic cross-sectional view in FIG. 1. In FIG. 1, the UV light emitting diode, generally represented at 10, comprises a substrate, 12. The primary function of the substrate is to provide a surface upon which the subsequent layers are grown. Although preferably made of sapphire, the substrate may be made of silicon carbide, GaN, AlN, AlGaN, InN, InGaN, AlInGaN, silicon, GaAs, $LiAlO_3$, $LiGaO_3$, ZnO or a metal. In addition, the substrate may have a crystallographic orientation along the C-plane, A-plane, M-plane, R-plane and have a mis-orientation ranging from 0.0° to 10° from its axis.

Deposited directly on the substrate, 12, is a super-lattice layer, 14. A super-lattice layer is a layer formed by pulsed deposition directly on the substrate without a low temperature buffer layer there between.

The super-lattice layer preferably comprises $AlN/Al_{1-x-y}In_yGA_xN$ layers with $0\leq x\leq1$, $0\leq y\leq1$, and $0<x+y\leq1$ which are deposited directly on the substrate with no low temperature buffer layer between the substrate and super-lattice layer. In one embodiment it is preferable that the Ga/Al ratio increases with distance from the substrate. In may be the same composition through the super-lattice or it may be altered as discussed further herein. It is preferred that the composition of the super-lattice be substantially the same as the first active layer at the interface therewith. Though referred to as a "layer" it is well understood in the art that the super-lattice layer comprises multiple sub-layers wherein subsequent layers may have the same or a different composition.

In a preferred embodiment the composition of the super-lattice is formed by controlling the flow of Group III precursors and/or ammonia in a pulsed fashion. The super-lattice is deposited at a temperature ranging from 700-1300° C. The group III precursors can be pulsed individually or in concert. The ammonia can be deposited at a constant flow rate while the group III precursor is pulsed or the group III precursor can be deposited at a constant flow rate and the ammonia pulsed. Alternatively, both the ammonia and group III precursors can be pulsed at differing rates to avoid mimicking constant relative flow. It is most preferred to pulse the ammonia while maintaining constant metal flow since this is the optimum for quality and growth rate. Pulsing both ammonia and metal provides the highest quality material but at the expense of growth rate. Pulses can be oscillated immediately between maximum flow and off, referred to in the art as a square wave, or the pulses can oscillate in incremental or continual downward, or upward flow rates till the maximum or minimum flow is reached.

The time taken to increase or decrease the flux of the Group III precursor ranges from at least 0.1 sec to about 60 secs. The flow is preferably stabilized at the increased or decreased flow conditions for at least 0.1 sec to about 120 secs.

The Group III precursor can be flown constantly while the Group V precursor, such as $NH_3$ or Nitrogen, is modulated from 0 sccm to 50,000 sccm. The time taken to increase or decrease the Group V flux range is at least 0.1 sec to about 120 secs and the flow is preferably stabilized at the increased or decreased flow conditions for at least 0.1 sec to about 120 secs.

The super-lattice layer is preferably defined by layers having at least one surface selected from (001), (110), (101), (102) or (104) facets.

The super-lattice layer is preferably deposited at a growth rate of at least 0.05 μm per hour with a root mean square roughness ranging from 1 Å to 100 Å.

In one embodiment the super-lattice layer comprises a nested super-lattice comprising at least two sub-layers with each sub-layer having different compositions. Each layer has a composition of $Al_{1-x-y}In_yGa_xN$ with $0 \leq x \leq 1$, $0 \leq y \leq 1$, and $0 < x+y \leq 1$. Nested super-lattices are set forth in commonly owned WO2009/120990, which is incorporated herein by reference.

With further reference to FIG. 1, the LED active layers are grown beginning with Group III-Nitride first semiconductor layer, 16, with a first type of conductivity, applied directly on the super-lattice layer, 14. It is preferred that the first semiconductor layer be an n+ layer comprises $Al_xIn_{1-x}Ga_{1-x-y}N$ (wherein $0 < x \leq 1$, $0 \leq y \leq 1$ and $0 < x+y \leq 1$) formed such that the layer is transparent to the light to be emitted from the quantum well active region, 18. The first conductive semiconductor layer, 16, is preferably given the first type of conductivity using silicon, or is co-doped using a combination of silicon, oxygen, and/or indium.

A quantum well active region, 18, is then formed on the first semi-conductive layer. The quantum well includes one or more barrier and one or more well sub-layers, each having different compositions such that the band-gap of the barrier layer is larger than that of the well layer. The thickness of the barrier and well layers should each preferably be between 1-200 Å. The well sub-layer preferably has a specific bandgap and is designed to provide a region with good quantum confinement, wherein electrons and holes readily combine, preferably with radiative and non-radiative recombination but with radiative recombination dominating the non-radiative recombination. The quantum well sub-layer preferably emits light in the range of 190 nm to 369 nm.

An optional, but preferred, p-type (second conductivity type) $Al_xIn_{1-x}Ga_{1-x-y}N$ (wherein $0 < x \leq 1$, $0 \leq y \leq 1$ and $0 < x+y \leq 1$) electron blocking layer, 20, is grown directly above the quantum well layer, 18. The band-gap of the electron blocking layer is larger than the bandgap of the barrier sublayer. Magnesium is preferably used as the p-type dopant. An optional, but preferred, p-type (second conductivity type) $Al_xIn_{1-x}Ga_{1-x-y}N$ (wherein $0 < x \leq 1$, $0 \leq y \leq 1$ and $0 < x+y \leq 1$) electron blocking layer, 20, is grown directly above the quantum well layer, 18. The band-gap of the electron blocking layer is larger than the bandgap of the barrier sublayer. Magnesium is preferably used as the p-type dopant.

A semiconductor layer, 22, with a second conductivity type, preferably a p-type layer, is formed on the electron blocking layer, 20, if present, or on the multiple quantum well, 18, if the electron blocking layer is not present. The band-gap of the second type semiconductor layer, 20, preferably decreases for each subsequent layer away from the support. Subsequent layers may be one single $Al_xIn_{1-x}Ga_{1-x-y}N$ (wherein $0 < x \leq 1$, $0 \leq y \leq 1$ and $0 < x+y \leq 1$) layer, or may consist of a compositionally graded layer, a series of decreasing composition superlattices, or several distinct layers with decreasing bandgap to afford adequate adherence to a contact.

The second type semiconductor layer is preferably formed by pulsing the group III precursors and/or the amine. In a particularly preferred embodiment the dopants are pulsed thereby forming a modulated doping. In a preferred embodiment at least one of the group III metals has a sinusoidal composition with a frequency of concentration varying with distance from the substrate. In another preferred embodiment the second type $Al_xIn_{1-x}Ga_{1-x-y}N$ (wherein $0 < x \leq 1$, $0 \leq y \leq 1$ and $0 < x+y \leq 1$) has a sinusoidal composition with a frequency concentration varying with distance from the substrate. The frequency of concentration of the group III precursor or nitrogen precursor may have a fixed frequency and amplitude or the frequency of concentration change and/or amplitude may vary with distance from the substrate. In other words, the concentration may oscillate from a predetermined high to a predetermined low systematically with distance or each subsequent high may be higher, or lower, than a previous high and each subsequent low may be higher, or lower, than a previous low or a combination thereof. In a particularly preferred embodiment the dopant, preferably magnesium may be entered at a pulsed deposition rate. In another preferred embodiment indium may be entered at a pulsed deposition rate. A pulsed dopant is referred to herein as modulated dopant concentration.

Modulated doping generates microlayers of alternating layers with one layer having a high doping and the next layer having a low doping as described elsewhere herein. Each microlayer is preferably 50-400 Angstroms in thickness and the layers may be built up to very large thicknesses which was previously not available. At least 50 layers is preferred up to 200 layers.

The active layers, which include the two conductive layers of differing polarity and quantum well layer there between, preferably comprise modulated doping with microlayers of 50-400 angstroms and a total thickness of 5 to 10 microns. The modulated doping forms a super lattice which allows the layers to be thicker than previously thought possible without crack formation.

Figure 2A:
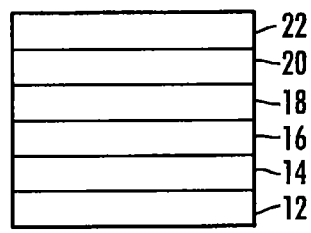
FIGS. 2A-B are cross-sectional schematic views of an embodiment of the invention.

An embodiment of the invention will be described with reference to FIGS. 2A-2B wherein a schematic cross-sectional view is provided. In FIG. 2A, a UV-emitting diode, is illustrated to contain a substrate, 12, super-lattice layer, 14, first type semiconductor layer, 16, quantum well, 18, optional electron blocking layer with second type conductivity, 20, and second type semiconductive layer, 22, as previously described.

Figure 2B:
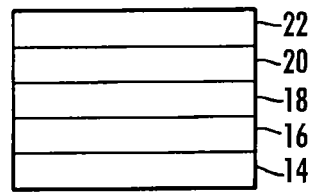

As illustrated in cross-sectional view in FIG. 2B, it is preferable to remove the substrate, 12. The template may be removed by polishing, etching or lifting-off using a laser with laser lift-off being preferred. A particular advantage of the invention is realized by the improved processing. When laser lift-off of the substrate is employed with a low temperature buffer the surface of the diode is undulated and not smooth due to inefficient cleavage. With the present invention laser lift-off results in a very clean substrate with minimal separation of the super-lattice material. The result is a high quality surface on the diode and a stable diode as a result. The higher quality is realized as lower surface scatter and more even attenuation.

Figure 3:
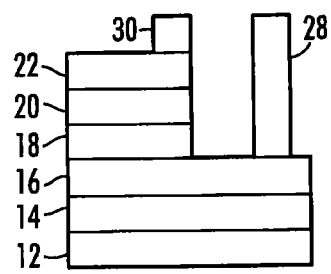
FIG. 3 is a cross-sectional schematic view of an embodiment of the invention.

A lateral embodiment of the invention is set forth in schematic cross-sectional view in FIG. 3 wherein the metal contacts are on a common side. In FIG. 3, the quantum well region, 18, optional electron blocking layer, 20, and second semiconductor layer are formed as a mesa or a mesa is created by reactive ion etching to access the first semiconductor layer, 16. A metallic contact, 28, can be applied to the layer of first conductivity, 16, which is preferably an n-layer. Similarly, a second metal contact, 30, can be applied to the second semiconductor layer, 22, which is preferably a p-layer. Though illustrated as present, the substrate, 12, is preferably removed preferably after the formation of the metal contacts. This is a key embodiment of the patent to provide lateral conduction substrate lifted-off deep UV light sources.

Figure 4:
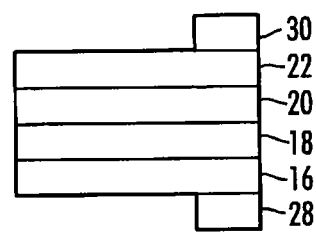
FIG. 4 is a cross-sectional schematic view of an embodiment of the invention.

A vertical embodiment of the invention is set forth in schematic cross-sectional view in FIG. 4 wherein the metal contacts are on opposite side. A metallic contact, 28, can be applied to the layer of first conductivity, 16, which is preferably an n-layer. Similarly, a second metal contact, 30, can be applied to the second conductivity type semiconductor layer, 22, which is preferably a p-layer. In this orientation the metal contacts are on opposing surfaces. Vertical geometry light emitting diodes are set forth in commonly owned WO/2008/054995 which is related to U.S. patent application Ser. No. 12/445,945, now U.S. Pat. No. 8,242,484, which is incorporated herein by reference.

The metallic contacts, 28 and 30, are deposited on both the n+ and p+ layers. Ti/Al/Ti/Au and Ni/Au are used as metal contacts for the n- and p-contacts, respectively, however, the n-metal contacts can be made of Ti, Al, Ni, Au, Mo, Ta or any combination of these metals. The p+ layer contact, can be made of Pd, Ni, Ag, Au, ITO, NiO, PdO or any combination of the above-mentioned metals. These contacts could be annealed in air, a forming gas, nitrogen or any combination of such. As would be apparent the layer arrangement can be reversed without consequence. A particular advantage of the present invention is that formation of the metallic contacts is improved due to the improved surfaces upon which the metallic contacts are applied, particularly, with regards to the surface separated from the substrate.

Figure 5:
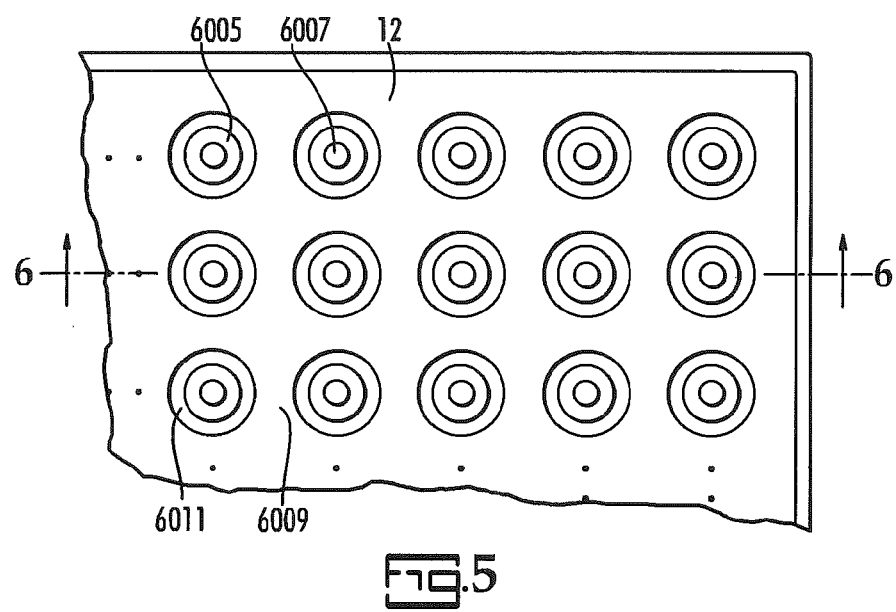
FIG. 5 is a top perspective view of a partial schematic representation of an embodiment of the invention.
Figure 6:
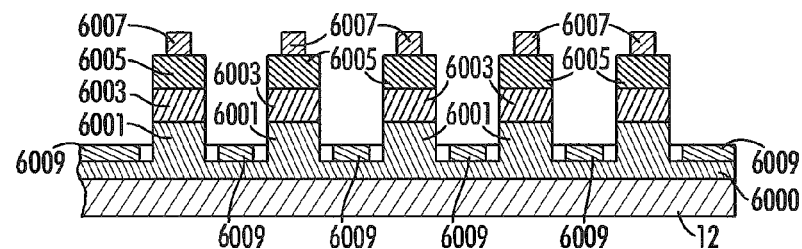
FIG. 6 is a side view of a schematic representation of an embodiment of the invention.

An embodiment of the invention prior to formation of a second electrical contact is illustrated schematically in top view in FIG. 5 and in cross-sectional view in FIG. 6. A substrate, 10, as described previously comprises the layer of first conductivity, 6000, applied thereto. It is preferred that the layer of first conductivity is an n-type layer. The layer of first conductivity has mesas, 6001, of common composition. The mesas may be formed during layer formation or the area there between may be etched. On the surface of each mesa is a quantum well, 6003. On the surface of the quantum well is a layer of second conductivity, 6005. The layer of second conductivity has a conductivity which is different than the conductivity of the layer of first conductivity as would be realized. The layer of first conductivity, quantum well and layer of second conductivity, taken together, form an LED and each layer may include multiple sublayers as further described herein. A second conductor, 6007, is in electrical contact with the layer of second conductivity. A charge spreading layer, 6009, is applied to the layer of first conductivity. It is preferred that the charge spreading layer be separated from the mesa by a gap, 6011, which may have non-conductive material therein. The separation between the mesa and charge spreading layer insures that electrical contact between the charge spreading layer and quantum well and/or second conductivity layer does not occur during manufacturing. It would be apparent that a current between the charge spreading layer and second conductive layer of a given LED would cause the LED to emit light.

The equivalent diameter of the mesas, also referred to as micropillars, is preferably about 500 µm or less. The equivalent diameter is the diameter of a circle with a surface area equivalent to the surface area of the shape being measured.

Figure 7:
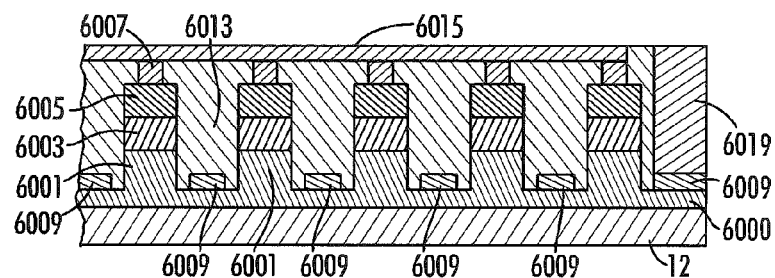
FIG. 7 is a side view schematic representation of an embodiment of the invention.

FIG. 7 is a cross-sectional schematic view of another embodiment of the invention. In FIG. 7, the area between the mesas comprises a passivation material, 6013, which forms a leakage current suppression layer. The device is planarized such that the leakage suppression layer and conductive layers form a single plane and a third conductive layer, 6015, is applied to be in contact with the second conductors, 6007. The third conductive layer can be a continuous layer such that when current is applied all LED's emit in unison. Alternatively, the third conductive layer may be in electrical contact with select LED's thereby allowing the LED's to illuminate individually or in select combinations. A conductive pillar, 6019, is formed such that the first and second conductors are terminated at a common face to facilitate flip-chip mounting as will be more fully described.

Figure 8:
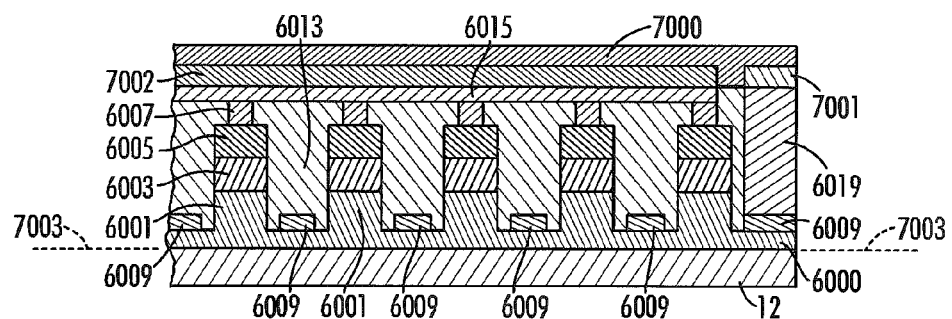
FIG. 8 is a side view schematic representation of an embodiment of the invention.

A particularly preferred embodiment is illustrated in FIG. 8. In FIG. 8, the embodiment of FIG. 7 is illustrated as mounted on a thermal carrier, also referred to as a conductive substrate, 7000. This is referred to as a flip-chip mounting. The conductive substrate, 7000, has associated therewith contacts, 7001 and 7002, for providing current to the LED. The conductive substrate provides two primary functions. The conductor functions as a heat sink thereby allowing heat to dissipate away from the LED which has many advantages as understood in the art. Once the LED is mounted on the conductive substrate the substrate, 12, used for formation of the LED can be removed along line 7003 thereby forming an LED with superior light emission properties. Particularly preferred thermal carriers include AlN, SiC, Cu, CuW or a copper alloy. In one preferred embodiment the novel metallic substrates such as Cu—W, Cu—Mo or Cu itself will be used which is a unique method of using metallic substrates for such lateral conducting LEDs. The flip-chip mounting can be done by standard techniques with gold-tin eutectic solder bonding and gold-gold thermocompression being preferred.

Each layer, other than the substrate, is made of a Group III-nitride, preferably $Al_xIn_yGa_{1-x-y}N$ (wherein $0<x\le1$, $0\le y\le1$ and $0<x+y\le1$). The precursor sources include a metal-organic source, ammonia, a carrier gas and, optionally, doping sources such as silane, and/or biscyclopentadienyl magnesium. The metal-organic source is preferably trimethyl aluminum, triethyl aluminum, trimethyl gallium, triethyl gallium, trimethyl boron, trimethyl iron, triethyl indium or trimethyl indium. The preferred carrier gas is hydrogen and/or nitrogen.

It is an ongoing desire to reduce resistance in a layer, and particularly, at the interface between layers. Resistance at the contact layers is a particular concern since this resistance is a source of heat. As current is increased the heat increases. This limits the current at which an LED can be operated. With silicon doping, this is a particular problem. The incorporation of indium in a layer significantly reduces the resistance of a layer. Indium is particularly desirable in doped layers such as silicon doped or magnesium doped layers as described in commonly assigned WO2009/120998, which corresponds to U.S. Pat. No. 7,097,608 and U.S. Pat. No. 7,097,708, which is incorporated herein by reference. At a given level of silicon doping, for example, incorporation of indium reduces the resistance thereby decreasing the heat generation which allows for an increase in the current at which the LED can be operated. In a silicon doped layer the indium is preferable present in an amount of atoms ranging from $10^{15}/cm^3$-$10^{24}/cm^3$. In a magnesium doped layer the indium is preferably present in an amount of atoms ranging from $10^{15}/cm^3$-$10^{24}/cm^3$.

The present invention may be used in conjunction with metallic carriers for thermal management as set forth in commonly owned U.S. patent application Ser. No. 12/512,682, now U.S. Pat. No. 8,354,678, which is incorporated herein by reference.

The present invention can be applied to polar, semi-polar or non-polar diodes. Non-polar UV light emitting diodes are described in commonly owned WO2009/005894, which corresponds to US Pub. 2010/0213436, which is incorporated herein by reference.

Layer deposition, methods and apparatus therefore are set forth in commonly owned WO2009/120975, which corresponds to U.S. Pat. No. 7,097,608 and WO2009/120986, which corresponds to U.S. Pat. No. 7,097,508, both of which are incorporated herein by reference.

The present invention has been described with reference to the preferred embodiments without limit thereto. Other embodiments, which are not specifically set forth, would be realized by one of skill in the art without departing from the scope of the instant invention as more specifically set forth in the claims appended hereto.

The invention claimed is:

1. A UV-emitting diode comprising:
a first conductive layer with a first type of conductivity, wherein said first conductive layer has micro-layers comprising $Al_xIn_{1-x}Ga_{1-x-y}N$ wherein $0<x\leq1$, $0\leq y\leq1$ and $0<x+y\leq1$ with each micro-layer being 30-40 angstroms thick;
a charge spreading layer on said first conductive layer;
a quantum well on said first conductive layer; and
a second conductive layer with a second type of conductivity on said quantum well, wherein said second conductive layer has micro-layers of sinusoidally varying concentrations of $Al_xIn_{1-x}Ga_{1-x-y}N$ wherein $0<x\leq1$, $0\leq y\leq1$ and $0<x+y\leq1$ from a predetermined high to a predetermined low systematically with each micro-layer being 30-40 angstroms thick.

2. The UV-emitting diode of claim 1, wherein said UV-emitting diode does not contain a buffer layer.

3. A UV-emitting diode comprising:
a first conductive layer with a first type of conductivity, wherein said first conductive layer has micro-layers of $Al_xIn_{1-x}Ga_{1-x-y}N$ wherein $0<x\leq1$, $0\leq y\leq1$ and $0<x+y\leq1$ with each micro-layer being 30-40 angstroms thick;
a charge spreading layer on said first conductive layer, said first conductive layer having at least two mesas extending beyond said charge spreading layer;
a quantum well on a surface of each of said at least two mesas; and
a second conductive layer with a second type of conductivity on a surface of each of said quantum wells, wherein said second conductive layer has micro-layers of sinusoidally varying concentrations of $Al_xIn_{1-x}Ga_{1-x-y}N$ wherein $0<x\leq1$, $0\leq y\leq1$ and $0<x+y\leq1$ from a predetermined high to a predetermined low systematically with each micro-layer being 30-40 angstroms thick;
wherein said first conductive layer, said charge spreading layer, said quantum wells and said second conductive layers form said UV-emitting diode.

4. The UV-emitting diode of claim 3, wherein a gap is provided to separate each of said at least two mesas from said charge spreading layer, said gap being sufficient to prevent electrical contact between said charge spreading layer and said quantum wells and said second conductive layers during manufacturing of said UV-emitting diode.

5. The UV-emitting diode of claim 4, wherein said gap contains a non-conductive material.

6. The UV-emitting diode of claim 4, wherein a passivation material is provided in an area between said at least two mesas to form a current suppression layer to suppress leakage current.

7. The UV-emitting diode of claim 6 further comprising:
a second conductor on each of said second conductive layers; and,
wherein said second conductors and said current suppression layer form a single plane.

8. The UV-emitting diode of claim 4 further comprising:
a second conductor on each of said second conductive layers; and,
a third conductive layer in electrical contact with said second conductors;
and wherein at least a portion of said charge spreading layer serves as a first conductor.

9. The UV-emitting diode of claim 8 further comprising:
a conductive pillar on said first conductor;
and wherein said conductive pillar and said third conductive layer terminate at a common face to facilitate flip-chip mounting of the UV-emitting diode.

10. The UV-emitting diode of claim 9, further comprising:
a first electrical contact on said pillar;
a second electrical contact on said third conductive layer; and,
a thermal carrier on said first and second electrical contacts to provide a flip-chip mounting on said UV-emitting diode.

11. The UV-emitting diode of claim 3, wherein said quantum wells comprise $Al_xIn_yGa_{1-x-y}N$ wherein $0<x\leq1$, $0\leq y\leq1$ and $0<x+y\leq1$.

12. The UV-emitting diode of claim 3, wherein said first conductive layer is a n-type layer.

13. The UV-emitting diode of claim 3, wherein said second conductive layer is a p-type layer.

14. The UV-emitting diode of claim 3, wherein said UV-emitting diode does not contain a buffer layer.

* * * * *